United States Patent [19]

Glatfelter et al.

[11] Patent Number: 5,569,332
[45] Date of Patent: Oct. 29, 1996

[54] OPTICALLY ENHANCED PHOTOVOLTAIC BACK REFLECTOR

[75] Inventors: Troy Glatfelter, Royal Oak; Kevin Hoffman, Sterling Heights; Chi C. Yang; Subhendu Guha, both of Troy, all of Mich.

[73] Assignee: United Solar Systems Corporation, Troy, Mich.

[21] Appl. No.: 511,887

[22] Filed: Aug. 7, 1995

[51] Int. Cl.$^6$ .................... H01L 31/06; H01L 31/075
[52] U.S. Cl. .................... 136/249; 136/256; 136/258; 136/259; 257/436
[58] Field of Search ................ 136/249 TJ, 256, 136/258 AM, 259; 257/436, 458, 459

[56] References Cited

U.S. PATENT DOCUMENTS

| | | | |
|---|---|---|---|
| 4,166,919 | 9/1979 | Carlson | 136/257 |
| 4,528,418 | 7/1985 | McGill | 136/256 |
| 4,571,448 | 2/1986 | Barnett | 136/259 |
| 4,578,527 | 3/1986 | Rancourt et al. | 136/256 |
| 5,101,260 | 3/1992 | Nath et al. | 257/53 |
| 5,221,854 | 6/1993 | Banerjee et al. | 257/431 |
| 5,261,970 | 11/1993 | Landis et al. | 136/259 |
| 5,303,322 | 4/1994 | Winston et al. | 385/146 |
| 5,403,405 | 4/1995 | Fraas et al. | 136/253 |

FOREIGN PATENT DOCUMENTS

| | | | |
|---|---|---|---|
| 2-201973 | 8/1990 | Japan | 136/259 |
| 5-259495 | 10/1993 | Japan | 136/259 |

*Primary Examiner*—Aaron Weisstuch
*Attorney, Agent, or Firm*—Gifford, Krass, Groh, Sprinkle, Patmore, Anderson & Citkowski, P.C.

[57] ABSTRACT

An optically enhanced back reflector for a photovoltaic device includes a back reflector layer of aluminum having a multi-layered, reflectivity enhancement member deposed thereon. The multi-layer enhancement member includes at least one pair of first and second layers, the first layer having a low index of refraction and the second layer having a high index of refraction. A layer of transmissive conductive oxide is disposed between the optically enhanced back reflector and the photovoltaic device.

17 Claims, 3 Drawing Sheets

OPTICALLY ENHANCED PHOTOVOLTAIC BACK REFLECTOR

FIELD OF THE INVENTION

This invention relates generally to photovoltaic devices and, more specifically, to back reflectors for re-directing unabsorbed, incident light through the photoactive layers of a photovoltaic device for further absorption. Most specifically, the invention relates to a back reflector having a multi-layered reflectivity enhancement member disposed thereon.

BACKGROUND OF THE INVENTION

Photovoltaic devices, particularly photovoltaic devices manufactured from deposited layers of thin film semiconductor material, preferably include a back reflector disposed beneath the photoactive semiconductor layers. A back reflector re-directs light which has passed through the photovoltaic body unabsorbed, back through that body for further absorption. The use of a back reflector increases the efficiency of the photovoltaic device and permits the use of relatively thinner layers of photoactive material, thereby enhancing the collection efficiency of the device as well as producing a savings in materials. In many instances, the back reflectors are textured so as to provide a diffuse reflecting surface which increases the path length of the reflected light and also provides for enhanced internal reflection.

It is fundamental that a back reflector must be highly reflective of light having a wavelength corresponding to the photo response spectrum of the semiconductor layers. In general, it has been found that metals such as aluminum, silver, and copper are good reflectors for thin film photovoltaic devices, such as silicon alloy devices. It is also most important that the materials comprising the back reflector not react with one another or with other materials in the photovoltaic device, either during manufacture of the device or its use. Such reactions can degrade the efficiency of the device and even render it inoperative.

Back reflector structures must also be mechanically compatible with the remaining layers of the photovoltaic device. The thinness of the layers can make the device sensitive to a number of mechanical defects. Spikes or other protrusions in the substrate or in the back reflector can produce shunts or short circuits through the semiconductor layers, thereby compromising device function. Additionally, a back reflector structure which cracks, deforms or otherwise delaminates from the substrate can destroy superadjacent semiconductor layers to the detriment of the device function. Accordingly, it will be appreciated that back reflectors for thin film photovoltaic devices should be highly reflective of light, non-reactive with adjacent layers of the device, and mechanically compatible with device structure and processing.

The simplest prior art approach to provide a back reflector comprises depositing the various layers of the photovoltaic device upon a highly polished substrate, typically stainless steel. However, while stainless steel is mechanically stable and non-reactive, it is not very highly reflective of light; the integrated reflectivity of most stainless steels is only about 45%. Furthermore, providing a textured reflective surface to the stainless steel is somewhat difficult. As a consequence, more sophisticated back reflector structures have been developed. For example, U.S. Pat. No. 5,101,260 discloses a multi-layered, light-scattering back reflector for a photovoltaic device, said back reflector including a first relatively hard, textured layer atop a substrate, a second highly reflective layer conformally disposed atop the first layer, and a trasparent oxide layer deposited upon the highly reflective layer, the oxide layer adapted to enhance light scattering and optical coupling. U.S. Pat. No. 5,296,045 discloses a composite back reflector for a photovoltaic device including an electrically conducting, texturizing layer disposed atop a substrate and a light reflecting layer conformally disposed atop the texturizing layer, the two layers being fabricated from materials which are mutually non-reactive over a temperature range of −20 degrees C. to 450 degrees C.

Prior attempts to use silver as the highly reflective material from which to fabricate the back reflectors for photoresponsive devices have been only partly successful. Silver and silver alloys present their own particular problems when employed as highly reflective back reflector material; i.e., silver, due to its relatively soft nature, tends easily to deform, particularly during the deposition of the body of semiconductor material, thus causing a loss of any textured surface. Also, deformation of the silver can create short circuit defects in cells, thereby decreasing overall production yields. Silver is also expensive as compared to other back reflector materials, such as, for example, aluminum. Furthermore, contact between the silver reflector and overlying layers can cause the silver to tarnish, thus reducing its reflectivity. Silver ions are also known to migrate into the semiconductor body, particularly if moisture enters the device. Furthermore, shadows falling on the device can cause a reverse bias which draws silver ions into the regions of the cell. While the afore-mentioned U.S. Pat. No. 5,296,045 to some extent overcomes some of these problems, it still requires the use of expensive silver as the primary back reflector material.

Aluminum, with or without a silicon alloying agent, is highly reflective of light (integrated reflectivity of about 88%), and the texture of the layer may be controlled via the parameters of the deposition process. Aluminum is somewhat reactive and, as a consequence, in most instances, it is coated with a protective layer of a conductive material, such as a metallic oxide, which may optionally include an additional metal. In some instances, the aluminum is deposited as a specular (smooth) reflector, and a textured protective layer is deposited thereatop to provide for light scattering. Back reflectors of this type are presently incorporated in a wide variety of photovoltaic devices and are disclosed, for example, in the aforementioned U.S. Pat. No. 5,101,260.

However, previous attempts to employ aluminum as the highly reflective material of a back reflector for a photoresponsive device have also been only partially successful because of the interdiffusion problems alluded to herein above. More particularly, when the amorphous silicon alloy material is deposited upon highly reflective material fabricated from aluminum, interdiffusion of the silicon and the aluminum from the contiguous layers results. Obviously the photogenerating and photoconductive properties of the body of silicon alloy material, as well as the reflective properties of the back reflector suffer. This, combined with the fact that aluminum is inherently less reflective than silver, has resulted in a preference for silver, despite its costliness and yield problems. While aluminum is a good light reflector, silver and copper are better yet, particularly for those portions of the electromagnetic spectrum which correlate to the response spectrum of thin film silicon alloy materials. In an attempt to improve production yields and to realize the cost savings from using less reflective but cheaper aluminum, the aforementioned U.S. Pat. No. 5,101,260 has proposed to provide a conventional aluminum silicon alloy back reflector with a relatively thin layer of silver deposited thereupon. However, it has been found that, while the silver enhanced the efficiency of the device somewhat, the efficiency is not as good as that attained using a thick silver/zinc oxide reflector.

Thus, there still exists a need for a back reflector which has the superb reflective qualities of a thick layer of silver, but does not have the associated yield problems, and which utilizes a cheaper material such as aluminum. There particularly exists a need for such a back reflector which can easily be manufactured in large quantities and which has spectral properties that can be manipulated according to the characteristics of the incident radiation.

SUMMARY OF THE INVENTION

Disclosed and claimed herein is a photoresponsive device which includes an optically enhanced, light-reflecting back reflector and a multi-layered body of semiconductor material deposited upon said back reflector. Optionally, the back reflector may be disposed on a metallic (such as stainless steel) substrate, or the device may employ a front, transparent (glass) "superstrate," which overlies the semiconductor body, and which serves as a base for subsequent deposition of the thin layers thereof. The invention is directed to an improved back reflector which comprises a metal back reflector layer and a multi-layer reflectivity enhancement member disposed thereon. The reflectivity enhancement member includes at least one pair of first and second layers, including a first layer of a material of a relatively low index of refraction and a second layer of a material having a higher index of refraction than that of the first layer. The enhancement member may include additional layer pairs, always of alternating high and low indices of refraction, but always includes a minimum of at least one layer pair.

In order to enhance the reflectivity of light (or other radiation) incident upon the device, the thicknesses of the layer pairs are carefully manipulated to provide for enhanced internal reflection. To that end, the thickness of each of the first and second layers is approximately an integral multiple of one-quarter the wavelength of the light to be reflected thereby in each of the respective materials, with a tolerance of plus or minus 20%.

In one embodiment, the first and second layer pairs are each formed of an optically transmissive material having the required optical properties. In a particularly preferred embodiment, the first layer is comprised of a material selected from the group consisting essentially of: magnesium fluoride, silicon dioxide, soda glass, borosilicate glass, transmissive conductive metal oxides, and combinations thereof.

In another embodiment, the material of the second layer is chosen from the group consisting essentially of: amorphous silicon alloys, hydrogenated Group IV alloy materials, and combinations thereof. However, chalcogenide glasses may be similarly employed.

Preferably, a layer of an optically transmissive, electrically conductive material is disposed on the top surface of the reflectivity enhancement member. In a preferred embodiment, the electrically conductive layer is formed of zinc oxide. The multi-layer semiconductor body is disposed on top of the conductive layer. In order to establish electrical communication between the semiconductor body and the back reflector, the device may further include a plurality of holes extending through the reflectivity enhancement layer from the electrically conductive layer to the back reflector layer. Photovoltaic devices having through-hole connections used in a different manner, are disclosed in, for example, copending U.S. Pat. No. 5,468,988, the disclosure of which is hereby incorporated by reference. Typically, these holes have a diameter in a range of between 10 and 75 microns, and a hole-to-hole spacing in a range of approximately 1 to 5 millimeters. A particularly preferred hole diameter is 30–40 microns, and a particularly preferred spacing is 1 millimeter.

In another preferred embodiment, the first layer material is magnesium fluoride which has an index of refraction of 1.38, and the second layer material is amorphous silicon which has an index of refraction of 3.5. Such a combination of materials are particularly useful with low bond gap silicon and silicon-germanium photovoltaic cells which are responsive to incident radiation of greater than approximately 600 nanometers. In particular, such silicon-germanium photovoltaic cells are particularly responsive to radiation in the near infrared region (700–950 nanometers); hence, considering the respective indices of refraction of magnesium fluoride and amorphous silicon, a desirable quarter-wave thickness for the first layer is approximately 1,000 angstroms, and a desirable quarter-wave thickness for the second layer is approximately 500 angstroms.

In another particularly preferred embodiment, a third layer of low refractive index material is added into the layer pair so that the second layer of high index material is sandwiched between two low index layers, and so that a reflection enhancement is established between the low index layer and the overlying high index semiconductor body or TCO layer. Such a structure yields a particularly efficient reflectivity in the wavelengths of interest.

BRIEF DESCRIPTION OF THE DRAWINGS

The following detailed descriptions is best understood by reference to the following drawings in which.

DETAILED DESCRIPTION OF THE PREFERRED EMBODIMENTS

Figure 1:
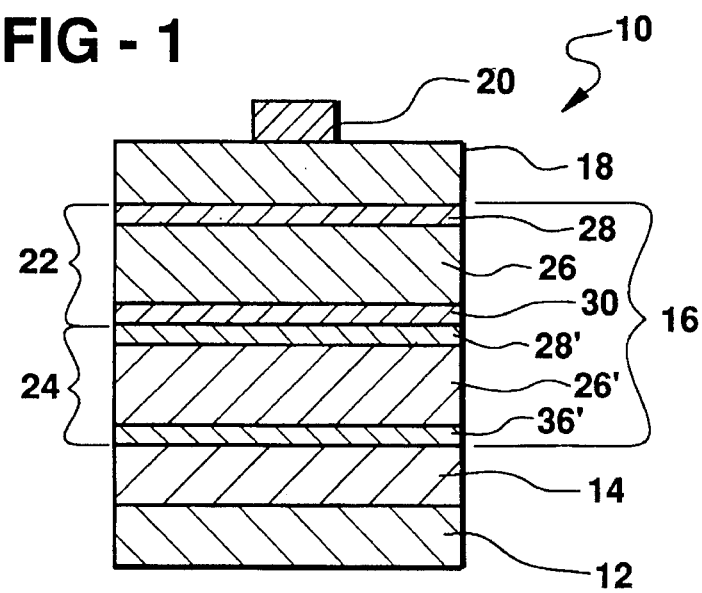
FIG. 1 is a cross-sectional view of a photovoltaic device structured according to the present invention.

Throughout the following detailed description, like numerals are used to reference the same element of the present invention shown in multiple figures thereof. Referring now to the drawings, and in particular to FIG. 1, there is shown a photovoltaic device 10 structured in accord with the present invention. The device 10 includes a substrate 12, an optically enhanced back reflector 14 disposed upon the substrate, a photovoltaic body 16 disposed upon the back reflector 14, and a layer of top electrode material 18 disposed atop the semiconductor body 16. In the illustrated embodiment, the photovoltaic device 10 includes a current collection grid 20 disposed upon the top electrode 18. In operation, incident light passes through the top electrode 18, which is preferably formed from a transparent, electrically conductive material such as transparent conductive oxide (TCO) and passes into the photovoltaic body 16 for absorption thereby. Light which is not absorbed by the photovoltaic body 16 is reflected from the back reflector structure 14 back therethrough for further absorption. The absorbed photons create electron-hole pairs in the photovoltaic body and, because of the particular electrical characteristics of the various layers of the photovoltaic body 16, these charged carriers are separated and conveyed to the top electrode 18 and electrically conductive substrate 12 (which forms the bottom electrode) for collection.

In one preferred embodiment, the substrate 12 is fabricated from stainless steel. Other substrate materials can include other types of steels, as well as metals such as aluminum, copper, and the like, or the substrate may comprise an electrically insulating support, such as a polymeric support having a conductive material supported thereupon. In some devices, a transparent "superstrate" is used as a base for depositing the other layers in reverse order, with the back reflector being deposited atop this "upside down" structure.

The depicted photovoltaic body 16 comprises two separate triads 22, 24 of layers of photovoltaic material. Each triad includes a layer of substantially intrinsic semiconductor alloy material 26, 26' interposed between oppositely doped semiconductor layers. In the illustrated embodiment, the intrinsic layer 26 in the first triad 22 is interposed between P doped 28 and N doped 30 layers, and the intrinsic body 26 of the second triad 24 is interposed between a layer of P doped material 28', and a layer of N doped material 30'. One particularly preferred semiconductor material comprises a thin film alloy of silicon with hydrogen and possibly halogens. Other materials comprise thin film alloys of germanium, as well as silicon/germanium alloys. In the illustrated embodiment, the layers of P doped material 28, 28' are preferably layers of microcrystalline silicon material, whereas the N doped 30, 30' layers are substantially amorphous layers of a silicon alloy. The first intrinsic layer 26 is a silicon-hydrogen alloy material and the second intrinsic layer 26' is a lower bond gap silicon-germanium-hydrogen alloy material. The device 10 is thus a spectrum-splitting tandem device of the type known in the art. It is to be understood that the back reflector of the present invention may be adapted to a wide variety of photovoltaic devices.

Figure 2:
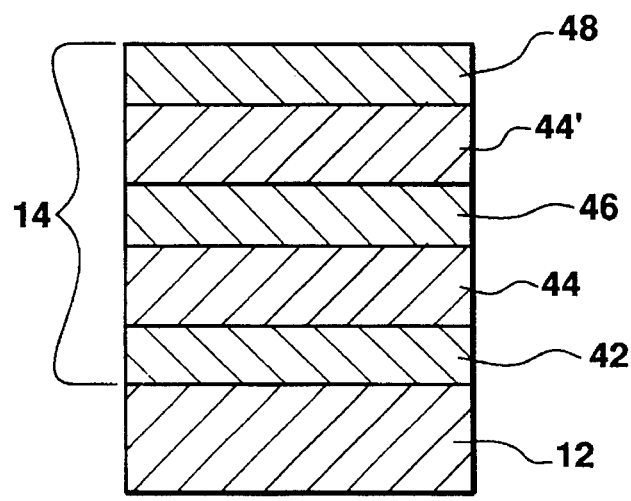
FIG. 2 is a cross-sectional view of the optically enhanced back reflector of the instant invention disposed upon a substrate.

The optically enhanced back reflector 14 of the FIG. 1 embodiment is a multi-layered structure, the details of which are illustrated in FIG. 2. Back reflector 14 is disposed upon substrate 12. Reflector 14 includes a metallic layer 42 which is preferably formed of aluminum. Disposed on metallic layer 42 is a first layer 44 of a material having a relatively low index of refraction. In the example, layer 44 is comprised of magnesium fluoride which has a refractive index of 1.38. Other low refractive index, optically transmissive materials suitable for use in the present invention include zinc oxide, tin oxide, indium oxide, cadmium stannate, other transparent conductive metal oxides, silicon dioxide, soda glass, borosilicate glass and the like. Disposed atop low refractive index layer 44 is a layer 46 comprised of a material having a high index of refraction. Preferably, layer 46 is formed of an amorphous silicon alloy material, which has an index of refraction of 3.5. However, other materials can be used, such as various chalcogenide glasses, hydrogenated Group IV alloy materials and various other alloys of silicon, germanium, and hydrogen, possibly including halogens and electrical dopants. It has been found by experiment that having the layer pair 44, 46 formed of, respectively, magnesium fluoride and amorphous silicon gives particularly good performance characteristics for the wavelengths of interest (600 nanometers, and particularly, 700–950 nanometers).

Disposed atop high index of refraction layer 46 is a second layer 44' of low index of refraction material. Thus, in a preferred embodiment, a layer 46 of amorphous silicon is sandwiched between two layers 44, 44' of magnesium fluoride.

The respective thicknesses of the layers 44, 46, 44' are calculated according to the formula:

$$Te = N(\tfrac{1}{4}\gamma/R_i) \pm 20\%$$

where Te stands for layer thickness, $\gamma$ is the wavelength to be reflected, $R_i$ is the index of refraction of the material making up the layer, and N is any integer. Thus, layers 44, 44' each have a thickness of approximately 1,000 angstroms and layer 46 has a thickness of approximately 500 angstroms.

Disposed atop the second low refractive index layer 44' is a layer 48 of a transparent, electrically conductive substance which is, in a preferred embodiment, zinc oxide, although other TCOs may be advantageously employed. The zinc oxide layer has several functions; because it is electrically conductive, it collects the current generated by the photovoltaic body 16 disposed thereon. Furthermore, it serves as a barrier layer and prevents migration or diffusion of ions from the back reflector 14 into the photovoltaic body 16.

It should be noted that zinc oxide, itself, has a relatively high index of refraction of 2.0. Thus, when added to the alternating high/low index refraction structure illustrated in FIG. 2, it serves as a second high index of refraction layer. Preferably, the thickness of zinc oxide layer 48 is approximately 875 angstroms, which represents a quarter wavelength condition.

In general, the larger the mismatch in indices between the high/low index of refraction layers, the higher the enhanced reflection. Also, in general, the greater the number of high/low index pairs, the higher the reflection. However, adding additional layer pairs tends to narrow the band width of the reflected energy. It has been found by experimentation, that the low/high/low refraction index structure of FIG. 2, when underlying an amorphous silicon/germanium cell gives back reflection characteristics very close to those of silver, itself, i.e., 98–99% at the wavelengths of interest.

Figure 3:
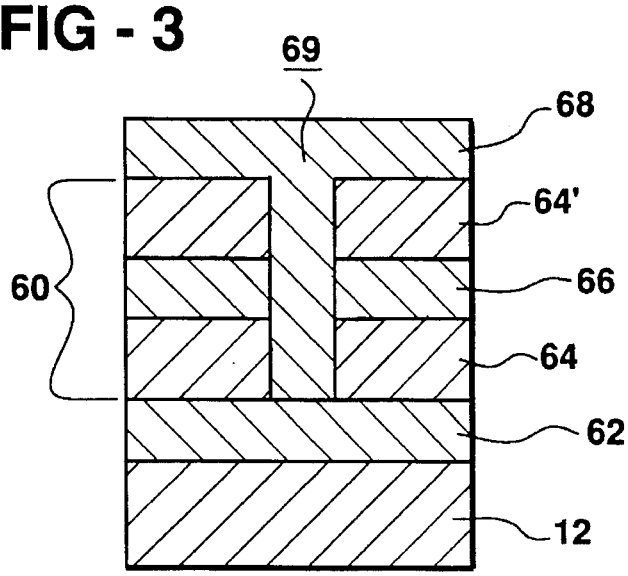
FIG. 3 is a cross-sectional view of an alternate embodiment of an optically enhanced back reflector according to the present invention.

In order to achieve a sufficiently low index of refraction in the low index material; it is generally necessary to use a dielectric material. Of course, a dielectric layer does not readily conduct current because of its high resistivity. To overcome this problem, an alternate embodiment 60 of the optically enhanced back reflector of the present invention which is illustrated in FIG. 3 as been designed. Like the FIG. 2 embodiment, the FIG. 3 embodiment includes a back reflector layer 62 formed of a metallic material such as aluminum. A first low index of refraction layer 64 is disposed atop the back reflector layer 62, and a high index of refraction layer 66 is disposed atop the first low index layer 64. A second layer 64' of low index material is disposed atop the high index layer 66. Finally, a layer of zinc oxide 68 is disposed atop the second low index layer 64'. However, in this embodiment, a plurality of holes 69 are drilled through the high and low index refraction layers 64, 66, 64'. Each hole 69 extends from the conductive zinc oxide layer 68' to, or through the conductive back reflector layer 62. The hole is preferably formed before deposition of the zinc oxide layer 68, and is subsequently filled thereby so as to establish a conductive path for electrical charge. Such holes may be drilled using a laser beam or beams of appropriate wavelength and intensity, or on by a directed electron beam. The holes 69 each have a diameter of between 10 and 75 microns and a hole-to-hole spacing of approximately 1–5 millimeters. Preferably, each hole 69 has a diameter of between 30 and 40 microns, and a hole spacing of 1 millimeter.

The hole spacing and size is important because, of course, the holes cut down on the overall efficiency of the cell. Furthermore, if the holes 69 are too large in diameter, there is a big loss in reflectivity. With spacing of one millimeter and holes of between 30–40 microns in diameter, it has been found that the loss in efficiency is less than 1%.

The aluminum back reflector layer 44 can be textured for more diffuse reflectivity in a manner known in the prior art. It is also possible to use the teachings of the present invention in an "upside down" cell in which glass or other transparent materials, such as polymeric materials, are used as a base for depositing the other layers thereon. In this case, the photo-responsive layers are deposited on the glass, and a layer of TCO, such as zinc oxide, is deposited atop the photo-responsive layers. The alternating low and high index of refraction layers are then deposited atop the TCO layer, with a final back reflective layer deposited thereatop. Again, holes may be provided through the high and low index of refraction layers to create conductive paths between the TCO layer and the back reflector.

Figure 4:
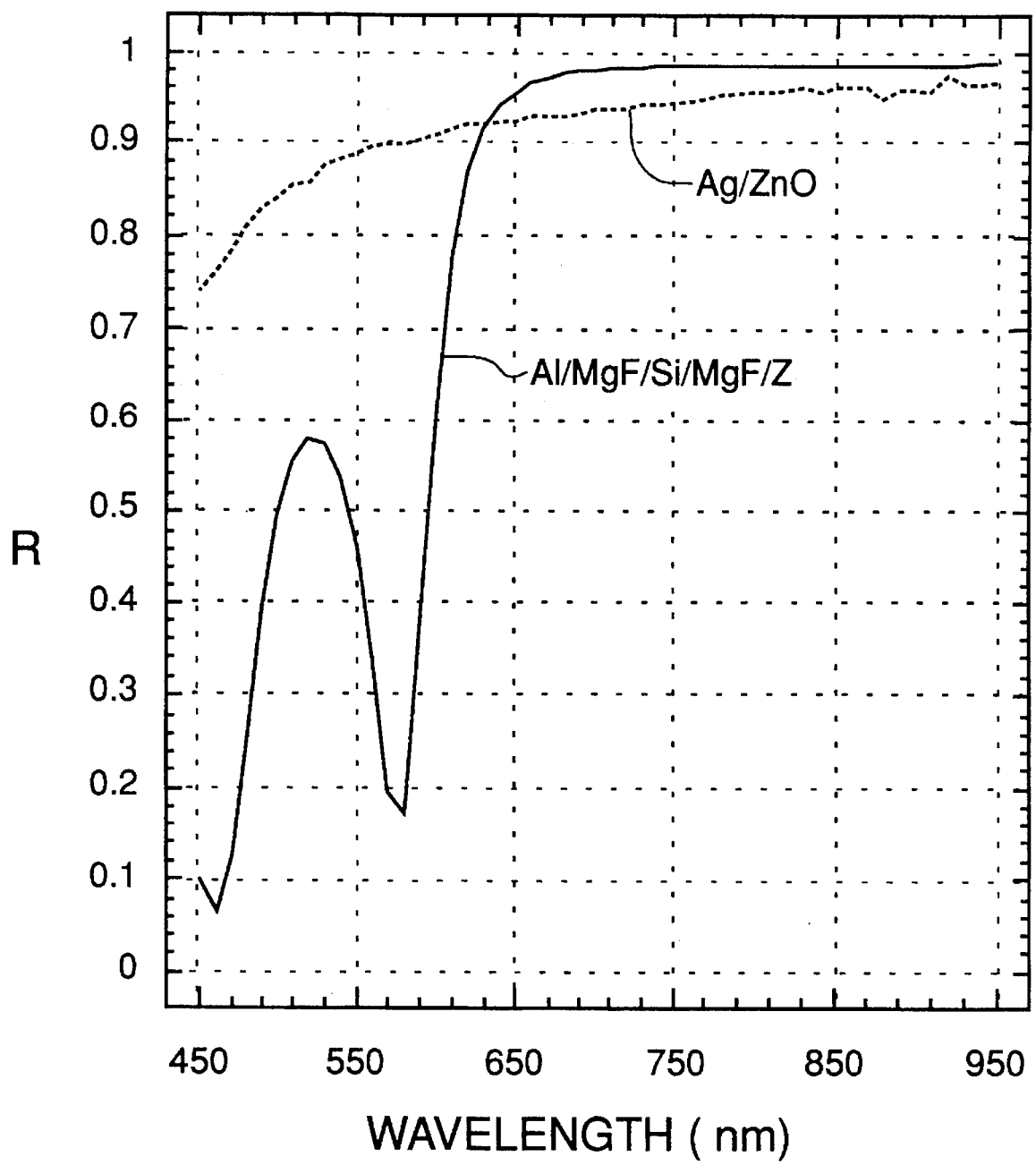
FIG. 4 is a graph plotting reflectivity against wavelength for both an optically enhanced aluminum back reflector of the present invention and a conventional silver reflector.
Figure 5:
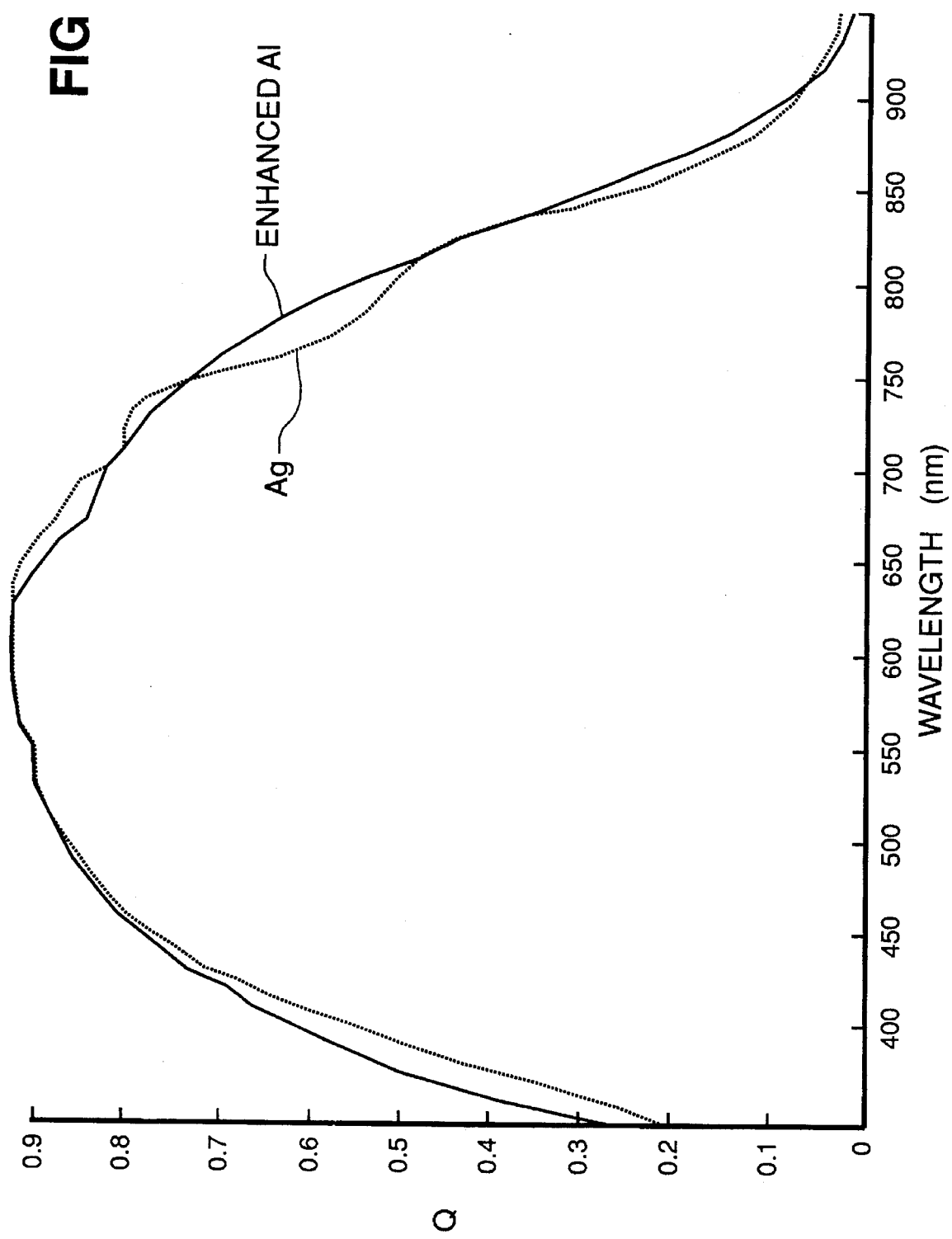
FIG. 5 is a graph plotting cell efficiency against wavelength for both the optically enhanced aluminum back reflector of the present invention and the conventional silver reflector.

FIGS. 4 and 5 are, respectively, graphs comparing the reflectivity of the optically enhanced back reflector of the present invention compared with silver plotted against, respectively, wavelengths and against "Q" (a figure of merit reflecting the quantum efficiency of the photovoltaic device). As can be seen from FIG. 4, the reflectivity of a photovoltaic device using an aluminum back reflector having a multi-layer reflectivity enhancement member deposited thereon which consists of alternating layers of magnesium fluoride/amorphous silicon/magnesium fluoride/zinc oxide at the wavelengths of interest (above about 580 nanometers) is equal to or better than that of a conventional silver back reflector coated with zinc oxide.

FIG. 5 shows even more graphically how the performance of the optically enhanced back reflector of the present invention closely mimics that of a conventional silver back reflector in terms of its effect on the efficiency of the photovoltaic device. Again, at the wavelengths of interest, the back reflector of the present invention results in performance at least as good as that achieved by a conventional silver back reflector.

Thus, the optically enhanced reflector of the present invention, which utilizes a multi-layer, reflectivity enhancement member consisting of alternating layers of low index and high index thin films deposited on an aluminum back reflector, overcomes the problems in the prior art noted above and results in a back reflector which is both inexpensive and easy to produce, and which performs as well as conventional silver back reflectors. Of course, it is to be understood that, while the present invention has been disclosed with reference to certain embodiments and exemplifications thereof, it could easily be modified by varying both the layer thicknesses, the materials of the various layers, and the number of layer pairs used to achieve different performance objectives. For example, greater numbers of high and low index of refraction layer pairs could be used to further improve the reflection of a relatively narrow band of wavelengths. Thus, the optically enhanced back reflector of the present invention could be used with other than the silicon based photovoltaic cell illustrated, and could be used to enhance the internal reflection of incident radiation of other wavelengths than those disclosed. However, such modifications are considered to be well within the ambit of one of skill in the art of thin film semiconductors, without departing from the spirit and scope of the present invention. Thus, it is the claims appended hereto, as well as all reasonable equivalents thereof, rather than the exact depicted embodiments and exemplifications, which define the scope of the present invention.

We claim:

1. A photovoltaic device with an optically enhanced back reflector, comprising:

a metallic back reflector layer;

a multi-layered reflectivity enhancement member disposed on said reflector layer, said member comprising at least one pair of layers, including a first layer of an optically transparent material having a relatively low index of refraction on said reflector layer and a second, overlying layer of a material having a higher index of refraction than that of the first layer, said first and second layers each having a thickness equal to an integral multiple of one-quarter of the wavelength of the light to be reflected in their respective materials, with a tolerance of plus or minus 20%;

an optically transmissive, electrically conductive layer disposed on top of said reflectivity enhancement member; and a multi-layer semiconductor body disposed on said conductive layer.

2. The device of claim 1 wherein said reflectivity enhancement member first layer is comprised of a material selected from the group consisting of: magnesium fluoride, silicon dioxide, transparent conductive metal oxides, soda glass, and combinations thereof.

3. The device of claim 1 wherein said reflectivity enhancement member second layer is comprised of materials selected from the group consisting of: hydrogenated Group IV alloy materials, amorphous silicon, and combinations thereof.

4. The device of claim 1 wherein said enhancement member first and second layers are comprised of, respectively, magnesium fluoride and amorphous silicon, said first layer having a thickness of approximately 1,000 angstroms and said second layer having a thickness of approximately 500 angstroms.

5. The device of claim 1 wherein said back reflector layer is comprised of aluminum.

6. The device of claim 1 wherein said optically transmissive, electrically conductive layer is comprised of a material selected from the group consisting of: zinc oxide, indium tin oxide, indium oxide, tin oxide, cadmium stannate, and combinations thereof.

7. The device of claim 1 wherein said back reflector layer comprises a substrate upon which said reflectivity enhancement member is disposed.

8. The device of claim 1 further comprising a transparent superstrate disposed upon said semiconductor body on a side thereof opposite said reflectivity enhancement member.

9. The device of claim 1 wherein said reflectivity enhancement member includes at least one layer of a dielectric material, said device further comprising a plurality of holes extending through said reflectivity enhancement member from said electrically conductive layer to said back reflector layer to establish electrical communication therebetween.

10. The device of claim 9 wherein said plurality of holes have a diameter in the range of 10–75 microns, and a hole spacing in the range of 1–5 millimeters.

11. The device of claim 1 wherein said semiconductor body includes at least one triad comprised of a layer of substantially intrinsic semiconductor material interposed between oppositely doped layers of semiconductor material.

12. The device of claim 11 wherein said semiconductor body comprises at least two of said triads disposed in a stacked relationship.

13. The device of claim 1 wherein said semiconductor body includes at least one layer of a hydrogenated Group IVA semiconductor material.

14. A photovoltaic device having an optically enhanced back reflector, comprising:

an aluminum back reflector layer;

a multi-layer reflectivity enhancement member disposed on said aluminum back reflector layer, said reflectivity enhancement member comprising at least one pair of first and second layers, said first layer being adjacent said reflector layer and comprised of magnesium fluoride and said second layer overlying said first layer and being comprised of an amorphous silicon alloy such that said second layer has a substantially higher index of refraction than said first layer, said first layer having a thickness of approximately 1,000 angstroms and said second layer having a thickness of approximately 500 angstroms;

a layer of zinc oxide disposed atop said reflectivity enhancement member; and a multi-layered semiconductor body disposed on said conductive layer.

15. A photovoltaic device having an optically enhanced back reflector, comprising:

an aluminum back reflector layer;

a multi-layer reflectivity enhancement member disposed on said aluminum back reflector layer, said member comprising at least one pair of first and second layers, said first layer disposed on said reflector layer and being comprised of an optically transparent dielectric material having a relatively low index of refraction, and said second layer overlying said first layer and being comprised of an optically transparent material having an index of refraction higher than that of said first layer, the layers of said member each having a thickness equal to an integral multiple of one-quarter of the wavelength of the light to be reflected in the respective materials, with a tolerance of plus or minus 20%;

a layer of a transparent, electrically conductive oxide disposed on top of said reflectivity enhancement member;

a multi-layer semiconductor body disposed on said conductive layer; and a plurality of holes extending through said reflectivity enhancement layer from said transparent, electrically conductive oxide layer to said back reflector layer to provide electrical contact therebetween:

16. The device of claim 15 where each of said plurality of holes has a diameter "D" in a range between 10 and 75 microns, said plurality of holes being spaced apart by a distance in the range of 1–5 millimeters.

17. The device of claim 16 wherein said hole diameter is in a range of 30 to 40 microns, and said hole spacing distance is one millimeter.

* * * * *